(12) United States Patent
Quy et al.

(10) Patent No.: US 12,137,527 B2
(45) Date of Patent: Nov. 5, 2024

(54) METHOD AND DEVICE FOR WATER INTRUSION MITIGATION

(71) Applicant: Rosemount Aerospace Inc., Burnsville, MN (US)

(72) Inventors: Dennis A. Quy, Apple Valley, MN (US); Curtis Wicks, Shakopee, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 767 days.

(21) Appl. No.: 17/230,281

(22) Filed: Apr. 14, 2021

(65) Prior Publication Data

US 2022/0061172 A1    Feb. 24, 2022

Related U.S. Application Data

(60) Provisional application No. 63/066,957, filed on Aug. 18, 2020.

(51) Int. Cl.
| | |
|---|---|
| *C25B 9/00* | (2021.01) |
| *C25B 1/04* | (2021.01) |
| *C25B 9/19* | (2021.01) |
| *C25B 15/021* | (2021.01) |
| *H05K 1/11* | (2006.01) |
| *H05K 5/02* | (2006.01) |
| *H05K 7/20* | (2006.01) |

(52) U.S. Cl.
CPC .............. *H05K 5/0213* (2013.01); *C25B 1/04* (2013.01); *C25B 9/19* (2021.01); *C25B 15/021* (2021.01); *H05K 1/115* (2013.01); *H05K 5/0217* (2013.01); *H05K 7/20* (2013.01)

(58) Field of Classification Search
CPC ........... C25B 15/021; C25B 9/19; C25B 1/04; H05K 1/115; H05K 5/0217; H05K 7/20
See application file for complete search history.

(56) References Cited

U.S. PATENT DOCUMENTS

| | | | |
|---|---|---|---|
| 10,511,037 B2 | 12/2019 | Ko | |
| 10,524,382 B2 | 12/2019 | Khachturov | |
| 2019/0192806 A1 | 6/2019 | Bahar et al. | |
| 2020/0107459 A1 | 4/2020 | Guillot et al. | |

FOREIGN PATENT DOCUMENTS

| | | |
|---|---|---|
| DE | 102009008233 A1 | 8/2010 |
| EP | 0401495 A1 | 12/1990 |
| KR | 20170041298 A | 4/2017 |
| WO | 2017091785 A1 | 6/2017 |

OTHER PUBLICATIONS

Extended European Search Report for EP Application No. 21191787.7, dated Jan. 27, 2022, 7 pages.

*Primary Examiner* — Zulmariam Mendez
(74) *Attorney, Agent, or Firm* — Kinney & Lange, P.A.

(57) ABSTRACT

A water intrusion mitigation device for use in enclosures housing electric components and equipment that are sensitive to humidity includes a thermoelectric cooler and a water electrolyzer. The thermoelectric cooler has two sides: a first side that is configured to be heated with the application of an electric current and a second side that is configured to cooled with the application of an electric current. The water electrolyzer is a proton exchange membrane that is in thermal communication with the second side of the thermoelectric cooler.

18 Claims, 7 Drawing Sheets

METHOD AND DEVICE FOR WATER INTRUSION MITIGATION

CROSS-REFERENCE TO RELATED APPLICATION(S)

This application claims the benefit of U.S. Provisional Application No. 63/066,957 filed Aug. 18, 2020, for "METHOD AND DEVICE FOR WATER INTRUSION MITIGATION" by D. Quy and C. Wicks.

BACKGROUND

The present invention relates generally to enclosures for electronic components and, more specifically, to protecting electronic components from water intrusion.

Humidity and condensed liquid water can be hazardous to electrical equipment in enclosures, such as those located on the external skin of an aircraft. When the aircraft is in flight, water vapor can enter the enclosure through small leaks in seams. After multiple flight cycles, the water vapor in the enclosure will accumulate to create an environment with high humidity and condense to form liquid water, which poses a danger to electronic equipment within the enclosure. Therefore, it is desirable to reduce the amount of liquid water in an enclosure, control the humidity level within the enclosure, or prevent water vapor from entering the enclosure.

Typical solutions for avoiding a buildup of condensed liquid water within the enclosure include providing a drain hole in a wall of the enclosure for the water to exit. Additional water intrusion mitigation solutions include designing tighter seams to prevent water vapor from entering the enclosure. While these solutions may be helpful, they do not eliminate the problem, particularly when a moving seam is required for the operation of the equipment within the enclosure or when a hermetic seal for the enclosure is not feasible.

SUMMARY

In one aspect, a water intrusion mitigation device for use in enclosures housing electric components and equipment that are sensitive to humidity includes a thermoelectric cooler and a water electrolyzer. The thermoelectric cooler has two sides: a first side that is configured to be heated with the application of an electric current and a second side that is configured to cooled with the application of an electric current. The water electrolyzer is a proton exchange membrane that is in thermal communication with the second side of the thermoelectric cooler.

In another aspect, a method of controlling the humidity levels in enclosures housing electric components includes cooling a proton exchange membrane of a water electrolyzer by a thermoelectric cooler. Water vapor within the enclosure condenses on the positive electrode side of the proton exchange membrane to form liquid water. The liquid water is split into hydrogen and oxygen gases. The hydrogen and oxygen gases are released back into the enclosure.

The present summary is provided only by way of example, and not limitation. Other aspects of the present disclosure will be appreciated in view of the entirety of the present disclosure, including the entire text, claims, and accompanying figures.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

The present disclosure introduces a water intrusion mitigation device that can control humidity in an enclosure and prevent water buildup and damage to electronics or equipment with materials sensitive to the presence of moisture within the enclosure, such as temperature or altitude sensors, angle of attack sensors, and cameras among other electronic components. With this device, condensation of water vapor can be controlled within the enclosure and limited in location to a small area on the device, where the liquid water can be electrolyzed to form hydrogen and oxygen gases. These gases are then released back into the enclosure, where they can safely remain or can exit the enclosure through the same leakage pathways allowing water vapor to enter.

Figure 1:
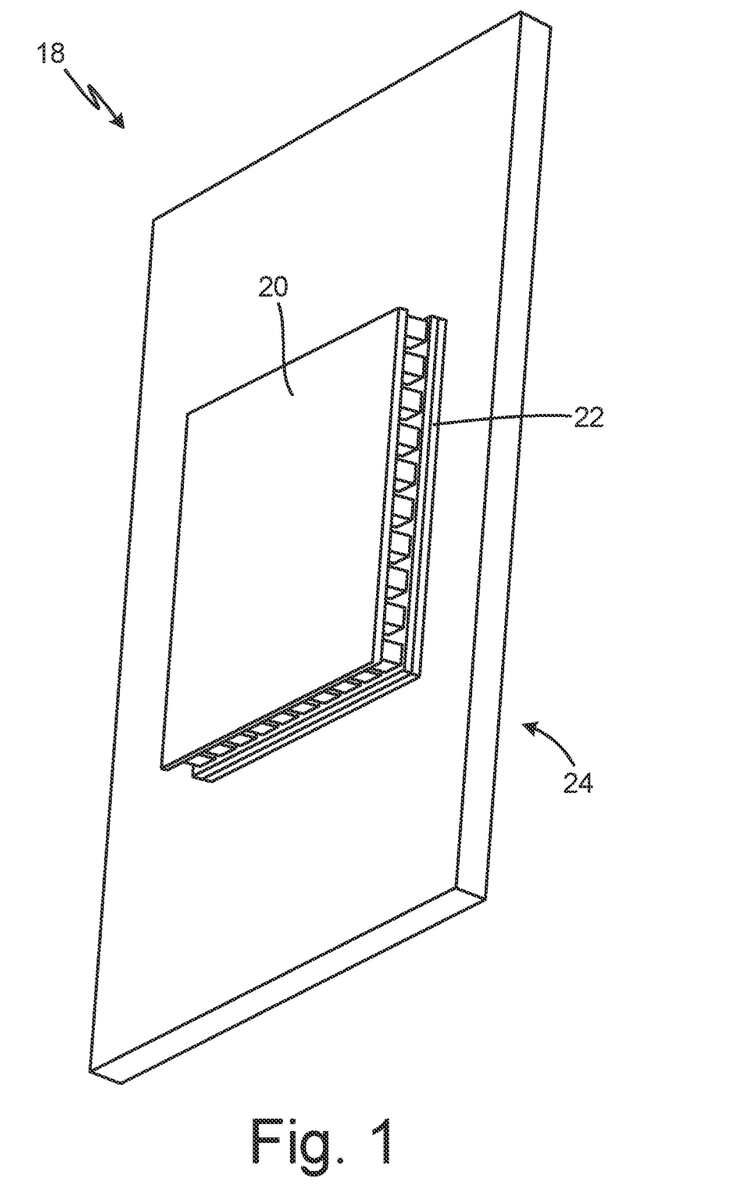
FIG. 1 is a perspective view of a back side of a water intrusion mitigation device according to the present invention.
Figure 2:
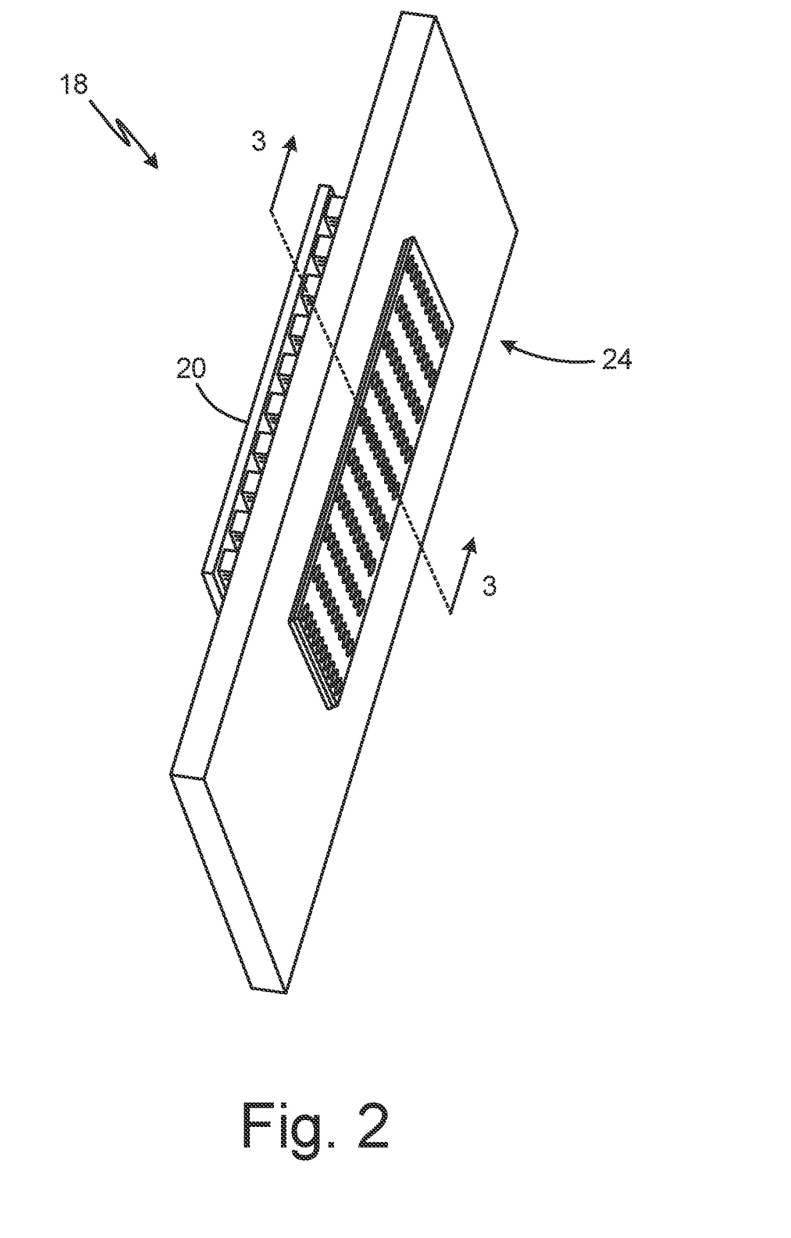
FIG. 2 is a perspective view of a front side of the water intrusion mitigation device of FIG. 1.

FIG. 1 is a perspective view of a back side of water intrusion mitigation device 18 showing thermoelectric cooler 20, conductive member 22, and water electrolyzer 24. FIG. 2 is a perspective view of a front side of the water intrusion mitigation device 18 showing thermoelectric cooler 20 and water electrolyzer 24. Conductive member 22 is disposed between thermoelectric cooler 20 and water electrolyzer 24 and is in thermal communication with thermoelectric cooler 20 and water electrolyzer 24. One side of conductive member 22 can be disposed in contact with thermoelectric cooler 20 and the opposite side of conductive member 22 can be disposed in contact with water electrolyzer 24. Thermoelectric cooler 20 is configured to be attached to an inside wall of an enclosure containing an electronic component or another structure within the enclosure. When installed in the enclosure, water electrolyzer 24 is arranged to face an open cavity of the enclosure as shown in FIGS. 3-6 (described below).

Thermoelectric cooler 20 is configured to draw heat from water electrolyzer 24 and through conductive member 22 to cool water electrolyzer 24 to a temperature below that of the ambient air of the enclosure and any other surface in the enclosure. The reduced temperature of water electrolyzer 24 will cause water to preferentially condense on water electrolyzer 24. Water electrolyzer 24 splits the condensed water into hydrogen and oxygen gases, which can be released from water intrusion mitigation device 18 back into the enclosure.

Water electrolyzer 24 can be a fuel-cell type electrolyzer with a proton exchange membrane as discussed further below. Oxygen can be formed on a side of the proton exchange membrane exposed to the cavity of the enclosure. Hydrogen can be formed at an opposite side of the proton exchange membrane and can exit water electrolyzer 24 through pathways in conductive member 22.

In some embodiments, water intrusion mitigation device 18 can be partially contained in a housing (not shown) made of plastic or another suitable material. A housing can be partially or fully open on the front side of water intrusion mitigation device 18 to allow water to condense on a surface of water electrolyzer 24.

Figure 3:
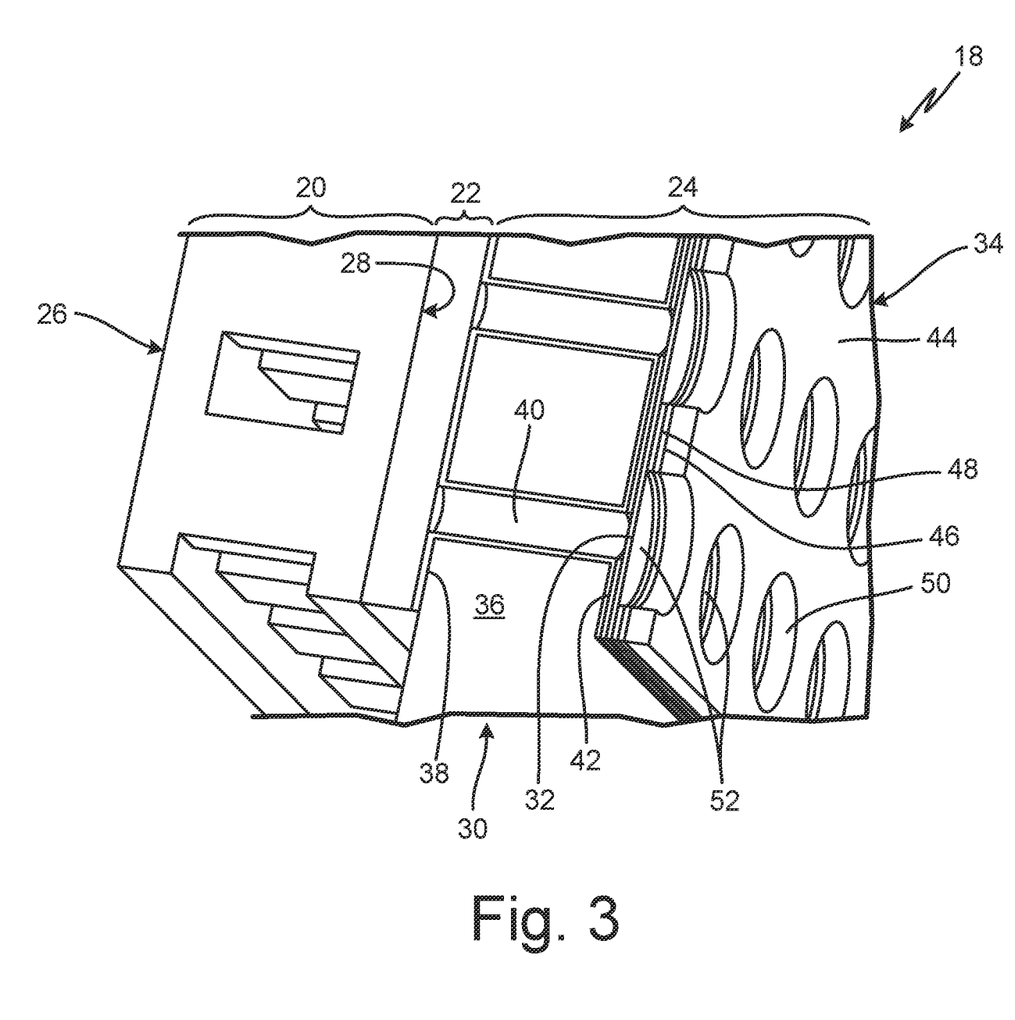
FIG. 3 is a partial cross-sectional view of the water intrusion mitigation device of FIG. 2 taken along the 3-3 plane.
Figure 4:
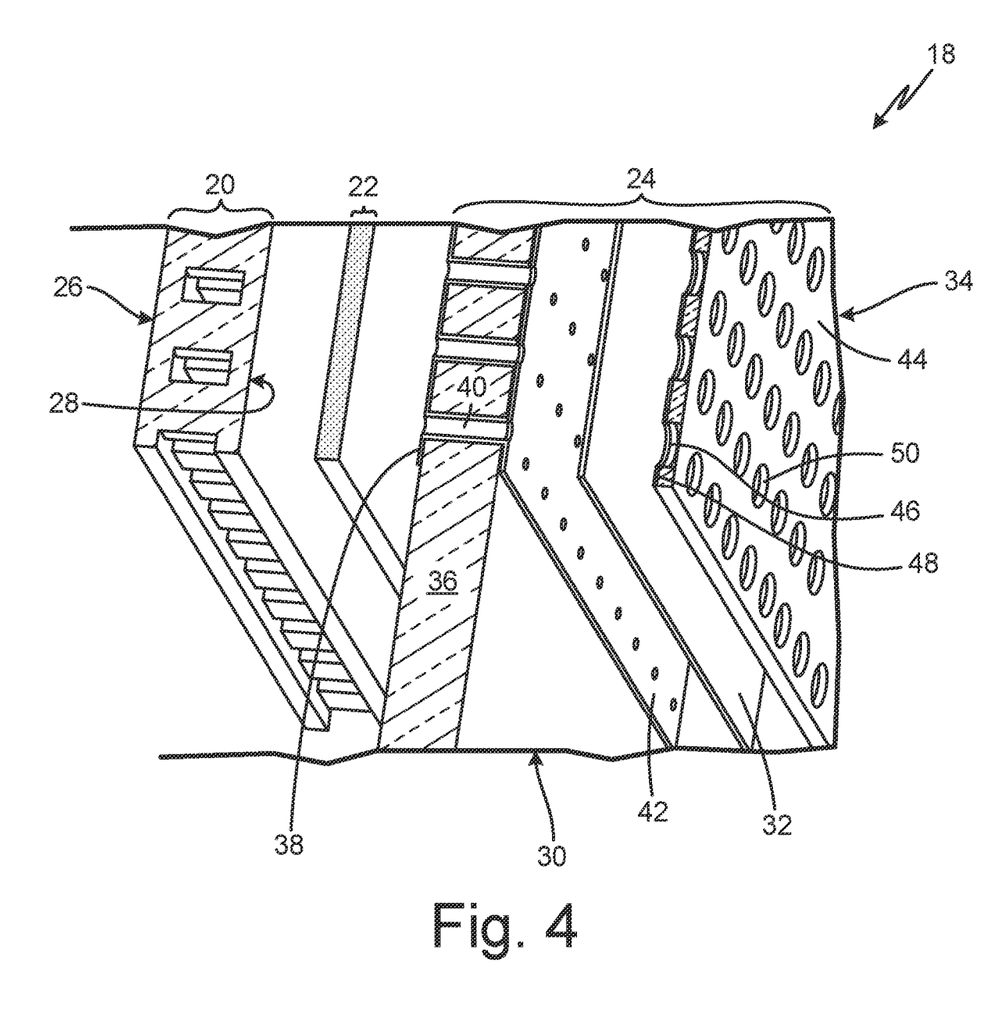
FIG. 4 is an exploded partial cross-sectional view of the water intrusion mitigation device of FIG. 3.

FIG. 3 is a cross-sectional view of water intrusion mitigation device 18 taken along the 3-3 line of FIG. 2. FIG. 4 is an exploded cross-sectional view of water intrusion mitigation device 18. FIGS. 3 and 4 are discussed together. FIGS. 3 and 4 illustrate a more detailed view of each component of water intrusion mitigation device 18. FIGS. 3 and 4 show thermoelectric cooler 20, conductive member 22, and water electrolyzer 24. Conductive member 22 is disposed between thermoelectric cooler 20 and water electrolyzer 24.

Thermoelectric cooler 20 includes hot side 26 and cool side 28. Cool side 28 is disposed adjacent conductive member 22. Hot side 26 is disposed adjacent an inside wall of the enclosure when installed.

Water electrolyzer 24 includes first printed circuit board 30, proton exchange membrane 32, and second printed circuit board 34. Proton exchange membrane 32 is disposed between first printed circuit board 30 and second printed circuit board 34. First printed circuit board 30 is disposed between proton exchange membrane 32 and conductive member 22. Second printed circuit board 34 is disposed between proton exchange membrane 32 and the cavity of the enclosure when installed. First printed circuit board 30 serves as a negative electrode for the operation of water electrolyzer 24. Second printed circuit board 34 serves as a positive electrode for operation of water electrolyzer 24. First printed circuit board 30 includes board material 36, copper coating 38, open vias 40, and conductive metal layer 42. Second printed circuit board 34 includes board material 44, copper coating 46, conductive metal layer 48, and openings 50. Proton exchange membrane includes condensing points 52.

Thermoelectric cooler 20 includes hot side 26 and cool side 28. Once activated with an electric current, thermoelectric cooler 20 transfers heat away from cool side 28 to hot side 26, creating a non-negligible temperature difference. Hot side 26 can be directly attached or indirectly attached (e.g., via a housing) to an inside wall of the enclosure or another structure within the enclosure using a variety of fastener means including, but not limited to, adhesive tape, removable fasteners, or permanent fasteners. Thermoelectric cooler 20 can be a conventional thermoelectric cooler known in the art operating using the Peltier effect to create heat flux. Hot side 26 can thermally transfer heat from water intrusion mitigation device 18 to the wall of the enclosure or structure within the enclosure adjacent to hot side 26.

Thermoelectric cooler 20 can draw heat away from other structures that are in direct or indirect thermal communication with cool side 28, including conductive member 22 and water electrolyzer 24. The non-negligible temperature difference between hot side 26 and cool side 28 in thermoelectric cooler 20 is needed to ensure the surface temperature at condensing points 52 on water electrolyzer 24 is lower than the dew point, which will cause water vapor in the air to gather and condense at the designated areas of condensing points 52. Generally, preferential condensation of water on electrolyzer 24 can occur if a temperature of cool side 28 is between 5-10 degrees Celsius less than the temperature of the enclosure. A temperature difference of less than 5 degrees Celsius may not be sufficient to reduce the relative humidity at condensing points 52 below the dew point of the enclosure, while a temperature difference above 10 degrees Celsius requires more current, lowering the efficiency of thermoelectric cooler 20. Thermoelectric cooler 20 can be configured to maintain a temperature above 32 degrees Fahrenheit (0 degrees Celsius) to prevent the liquid water condensing on water electrolyzer 24 from freezing.

Conductive member 22 defines the space between cool side 28 of thermoelectric cooler 20 and first printed circuit board 30 of water electrolyzer 24. Conductive member 22 can be a thermally conductive material. Conductive member 22 is in thermal communication with both cool side 28 and first printed circuit board 30, allowing thermoelectric cooler 20 to draw heat from water electrolyzer 24. Conductive member 22 also acts as an escape route for hydrogen gas created during electrolysis in water electrolyzer 24. Conductive member 22 can include pathways that permit hydrogen gas to travel through conductive member 22 and into the enclosure. Conductive member 22 can be made of porous material with an open and connected porosity, wherein gas can move through the porous material and exit from water intrusion mitigation device 18 unimpeded. Alternatively, conductive member 22 can be a thermally conductive material, such as metal, that includes etched, machined, stamped, or otherwise formed pathways on a side facing first printed circuit board 30. It will be understood by one of ordinary skill in the art that materials that are thermally conductive and that can provide pathways for hydrogen gas may be suitable for use as conductive member 22 and that conductive member 22 is not limited to the embodiments disclosed.

First printed circuit board 30 is in thermal communication with conductive member 22 and configured to conduct heat from proton exchange membrane 32 to conductive member 22. First printed circuit board 30 acts as a negative electrode in water electrolyzer 24. First printed circuit board 30 includes board material 36, copper coating 38, open vias 40, and conductive metal layer 42. Open vias 40 extend through first printed circuit board 30. Copper coating 38 provides a conductive layer on both an inner side of board material 36 facing proton exchange membrane 32 and an outer side of board material 36 facing conductive member 22 and also lines the inside of open vias 40.

Board material 36 can be made of FR4 material as known in the art or other suitable material. FR4 material is inexpensive and well known in the art. In some embodiments, board material 36 can be thinner than board material 44 of second printed circuit board 34 to promote heat transfer out of water electrolyzer 24 and into thermoelectric cooler 20 (shown in FIG. 6).

Copper coating 38 conducts electricity for the operation of water electrolyzer 24 and conducts heat away from proton exchange membrane 32, thereby cooling proton exchange member 32. Copper coating 38 serves as a negative electrode for the operation of water electrolyzer 24. Protons formed at the positive electrode side of proton exchange membrane 32 migrate across proton exchange membrane 32 to the negative electrode side, where they combine with electrons to form hydrogen gas. Copper coating 38 can cover the surface of both inner and outer sides of board material 36 and can line the inside of open vias 40. Copper coating 38 can serve to conduct heat from proton exchange membrane 32 to conductive member 22. Copper coating 38 can be etched to provide circuitry to control the operation of water intrusion mitigation device 18 as described further below.

Open vias 40 extend through first printed circuit board 30, connecting one side of first printed circuit board 30 to the other. The inside of open vias 40 can be lined by copper coating 38 to conduct heat away from proton exchange membrane 32 toward cool side 28 of thermoelectric cooler 20. Open vias 40 can allow hydrogen gas to exit water electrolyzer 24 and move into conductive member 22, which provides pathways for hydrogen gas to exit water intrusion mitigation device 18.

Conductive metal layer 42 is disposed between the inner side of first printed circuit board 30 and proton exchange membrane 32. Conductive metal layer 42 has openings corresponding with openings in copper coating 38 and open vias 40 to allow for passage of hydrogen gas into open vias 40. Conductive metal layer 42 can be a protective layer of electrically conductive metal capable of transmitting electric current from copper coating 38 and capable of protecting copper coating 38 from the acidic environment created by proton exchange membrane 32 during the process of electrolysis. Conductive metal layer 42 can be made from an electrically conductive metal suitable for protecting copper coating 38 from corrosion, including but not limited to platinum, gold, or iridium. Conductive metal layer 42 can be a thin layer of less than five microns in thickness applied using deposition techniques know in the art (e.g., a vacuum or electrodeposition process can be used to deposit a platinum layer and an immersion process can be used to deposit a gold layer).

Second printed circuit board 34 acts as a positive electrode in water electrolyzer 24. Second printed circuit board 34 includes board material 44, copper coating 46, conductive metal layer 48, and openings 50. Second printed circuit board 34 is disposed in contact with proton exchange membrane 32 and can be sized to match a surface area of proton exchange membrane 32 as illustrated in FIG. 2. Openings 50 extend through second printed circuit board 34 to expose portions of a surface of proton exchange membrane 32. The exposed surface portions form condensing points 52 where condensed water reacts.

Board material 44 can be made of the same material as board material 36 in first printed circuit board 30, including but not limited to FR4 material. In some embodiments, board material 44 can have a greater thickness than board material 36 of first printed circuit board 30 to minimize heat transfer into proton exchange membrane 32 from the surrounding environment in the enclosure (shown in FIG. 6).

Copper coating 46 serves as a positive electrode for the operation of water electrolyzer 24. Oxygen, protons, and electrons are formed at the positive electrode side of proton exchange membrane 32 when electric current is supplied. Copper coating 46 can cover the surface of an inner side of board material 44 facing proton exchange membrane 32. Copper coating 46 contains openings corresponding to openings 50 in second printed circuit board 34 to expose condensing points 52.

Conductive metal layer 48 is disposed between proton exchange membrane 32 and second printed circuit board 34. Conductive metal layer 48 can be a protective layer of electrically conductive metal capable of protecting copper coating 46 from the acidic environment created by proton exchange membrane 32 during the process of electrolysis. Conductive metal layer 48 can be made from the same material as conductive metal layer 42 of first printed circuit board 30. Conductive metal layer 48 includes openings corresponding to openings 50 in second printed circuit board 34 and copper coating 46 to expose condensing points 52.

Openings 50 can be any shape and can be evenly spaced or otherwise distributed. Openings 50 can be sized to balance the need for condensing points 52 and the need for a positive electrode for operation of water electrolyzer 24, as larger openings provide more space for condensation, but reduce the amount of conductive material on second printed circuit board 34. As thermoelectric cooler 20 lowers the temperature of water electrolyzer 24, condensing points 52 define a region for water vapor within the enclosure to condense into liquid water.

Proton exchange membrane 32 is disposed between first printed circuit board 30 and second printed circuit board 34. After thermoelectric cooler 20 draws heat from water electrolyzer 24, water vapor can preferentially gather at condensing points 52 of proton exchange membrane 32 and condense to form liquid water. When a current is applied to water electrolyzer 24, proton exchange membrane 32 splits the liquid water on condensing points 52 into oxygen, protons, and electrons. The protons pass through proton exchange membrane 32 and are combined with electrons from the negative electrode side of the circuit to form hydrogen gas.

Hydrogen gas formed at the negative electrode side of proton exchange membrane 32 move into first printed circuit board 20. The hydrogen gas enters open vias 40 of first printed circuit board 30 and moves into pathways of conductive member 22, from which it is released into the enclosure. Oxygen formed at condensing points 52 on second printed circuit board 34 is released into the enclosure from condensing points 52. The conversion of liquid water into hydrogen and oxygen gases at condensing points 52 can create a drier environment at condensing points 52, but a partial pressure created by the humidity within the enclosure will continuously force water vapor onto condensing points 52.

Figure 5:
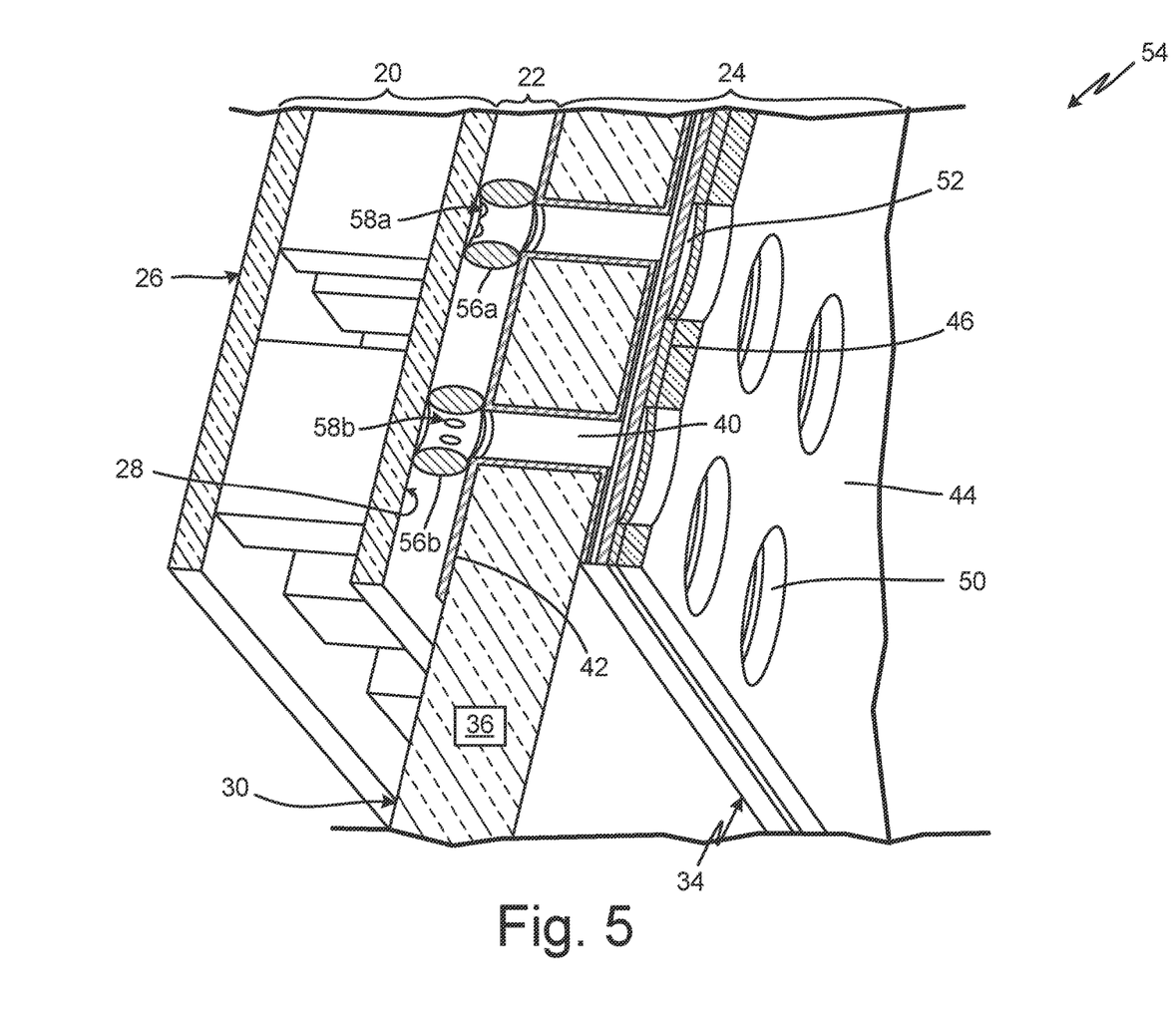
FIG. 5 is a partial cross-sectional view of another embodiment of the water intrusion mitigation device.

FIG. 5 shows a cross-sectional view of water intrusion mitigation device 54. Water intrusion mitigation device 54 is substantially the same as water intrusion mitigation device 18 of FIGS. 1-4 but with a different conductive member. As illustrated in FIG. 5, the conductive member can be a series of conductive metal rings 56a, 56b. Conductive metal rings 56a, 56b can be sandwiched between cool side 28 of thermoelectric cooler 20 and the outer side of first printed circuit board 30. Conductive metal rings 56a, 56b can be soldered onto the outer side of first printed circuit board 32. Conductive metal rings 56a, 56b are in thermal communication with both cold side 28 of thermoelectric cooler 20 and first printed circuit board 32, allowing thermoelectric cooler 20 to transfer heat away from water electrolyzer 24. Each conductive metal ring 56a, 56b can be laid flat, with a hole of each ring circumscribing an open via 40, allowing hydrogen gas to flow from open via 40 into the hole of conductive metal ring 56a, 56b. Conductive metal rings 56a, 56b allow the hydrogen gas to escape out of water intrusion mitigation device 54 through apertures 58a, 58b. Multiple types of apertures are contemplated and not limited to those illustrated in FIG. 5. As shown, apertures 58a can be notches cut into one or both side surfaces of conductive metal rings 56a such that openings are formed between conductive metal rings 56a and thermoelectric cooler 20 and/or between conductive metal rings 56 and first printed circuit board 32. Alternatively, apertures 58b can be holes or slits cut through metal rings 56b. Each metal ring 56a, 56b can include a plurality of apertures 58a or 58b. Apertures 58a or 58b can be arranged to provide openings spaced about the circumference of each metal ring 56a, 56b. Both types of apertures 58a and 58b are shown in FIG. 5 for illustrative purposes only. It will be understood by one of ordinary skill in the art that only one type of aperture 58a or 58b would generally be selected for any given embodiment.

Figure 6:
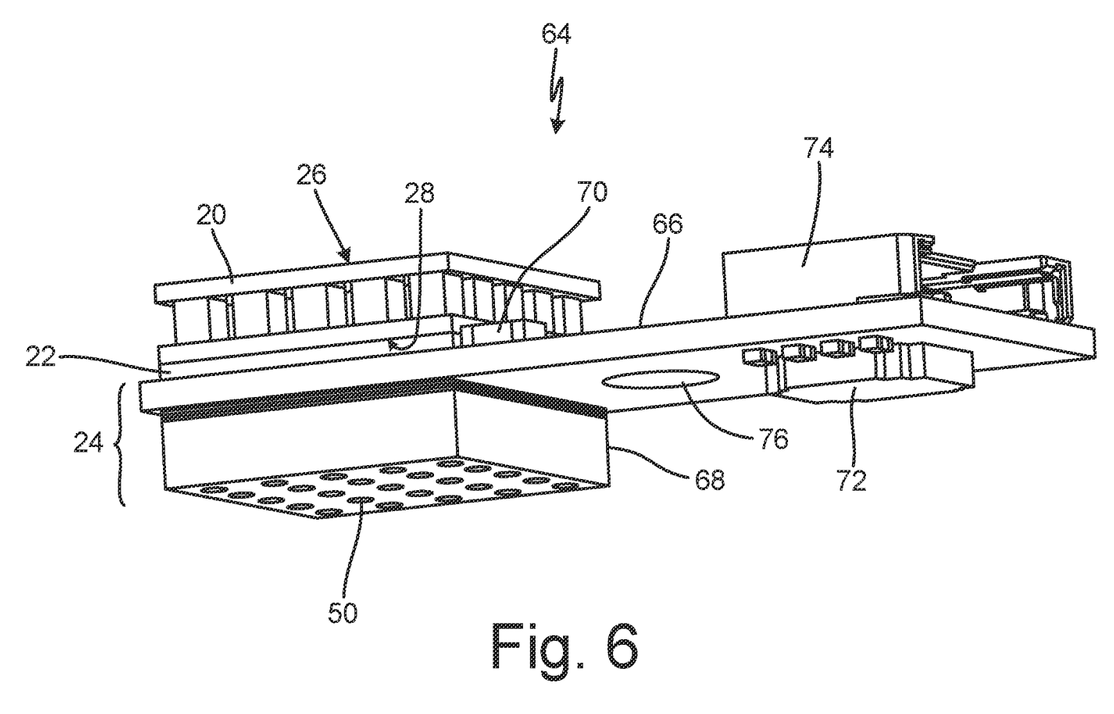
FIG. 6 is a perspective side view of an embodiment of the water intrusion mitigation device.

FIG. 6 shows a perspective side view of water intrusion mitigation device 64. Water intrusion mitigation device 64 is substantially the same as water intrusion mitigation device 18 of FIGS. 1-4 with alternative first printed circuit board 66 and second printed circuit board 68. FIG. 6 shows thermoelectric cooler 20, with hot side 26 and cool side 28, conductive member 22, and water electrolyzer 24, with first printed circuit board 66, proton exchange membrane 32, second printed circuit board 68 and openings 50. FIG. 6 additionally shows temperature sensor 70, controller 72, and connector 74 disposed on first printed circuit board 66. In alternative embodiments, temperature sensor 70, controller 72, and connector 74 can be disposed on second printed circuit board 68. FIG. 6 additionally shows hole 76, which can be used to mount or secure water intrusion mitigation device 64 to a wall or component within an enclosure. First printed circuit board 66 and second printed circuit board 68 include board material, copper coating, and metal layer as described with respect to FIGS. 3-5. As illustrated in FIG. 6, first printed circuit board 66 is thinner than second printed circuit board 68. As previously described with respect to water intrusion mitigation device 18, the thicknesses of first and second printed circuit boards 66 and 68 can be designed to improve thermal conduction between thermoelectric cooler 20 and water electrolyzer 24 and reduce heat transfer from the enclosure to water electrolyzer 24. The reduced thickness of first printed board 66 can increase heat transfer out of water electrolyzer 24 and into thermoelectric cooler 20. The increased thickness of second printed circuit board 68 can minimize heat transfer to proton exchange membrane 32 from the surrounding environment in the enclosure.

Controller 72 can be a binary controller that allows current to flow to thermoelectric cooler 20, transferring heat between two electrical junctions to remove heat at cool side 28 and deposit heat at hot side 26, unless temperature sensor 70 detects a temperature at or below 32 degrees Fahrenheit (0 degrees Celsius). At that point, controller 72 can block current flow to thermoelectric cooler 20 or reverse the current, which will allow water intrusion mitigation device 64 to warm up to prevent freezing of condensed water. Temperature sensor 70 can be a thermocouple, resistance temperature detector, thermistor, or other type of sensor as known in the art. Connector 74 can connect water intrusion mitigation device 64 to a power supply via a wired connection. In alternative embodiments, connector 74 can be disposed separate from water intrusion mitigation device 64 and connected to water intrusion mitigation device 64 via wired connections.

Although not illustrated, it will be understood by one of ordinary skill in the art that temperature sensor 70, controller 72, connector 74, and additional components can be incorporated into water intrusion mitigation devices 18 and 54. In some embodiments, water intrusion mitigation device 18, 54, 64 can be incorporated into the electronic component or circuitry water intrusion mitigation device 18, 54, 64 is intended to protect. For example, water intrusion mitigation device 18, 54, 64 can be added as a component to an existing circuit board.

Figure 7:
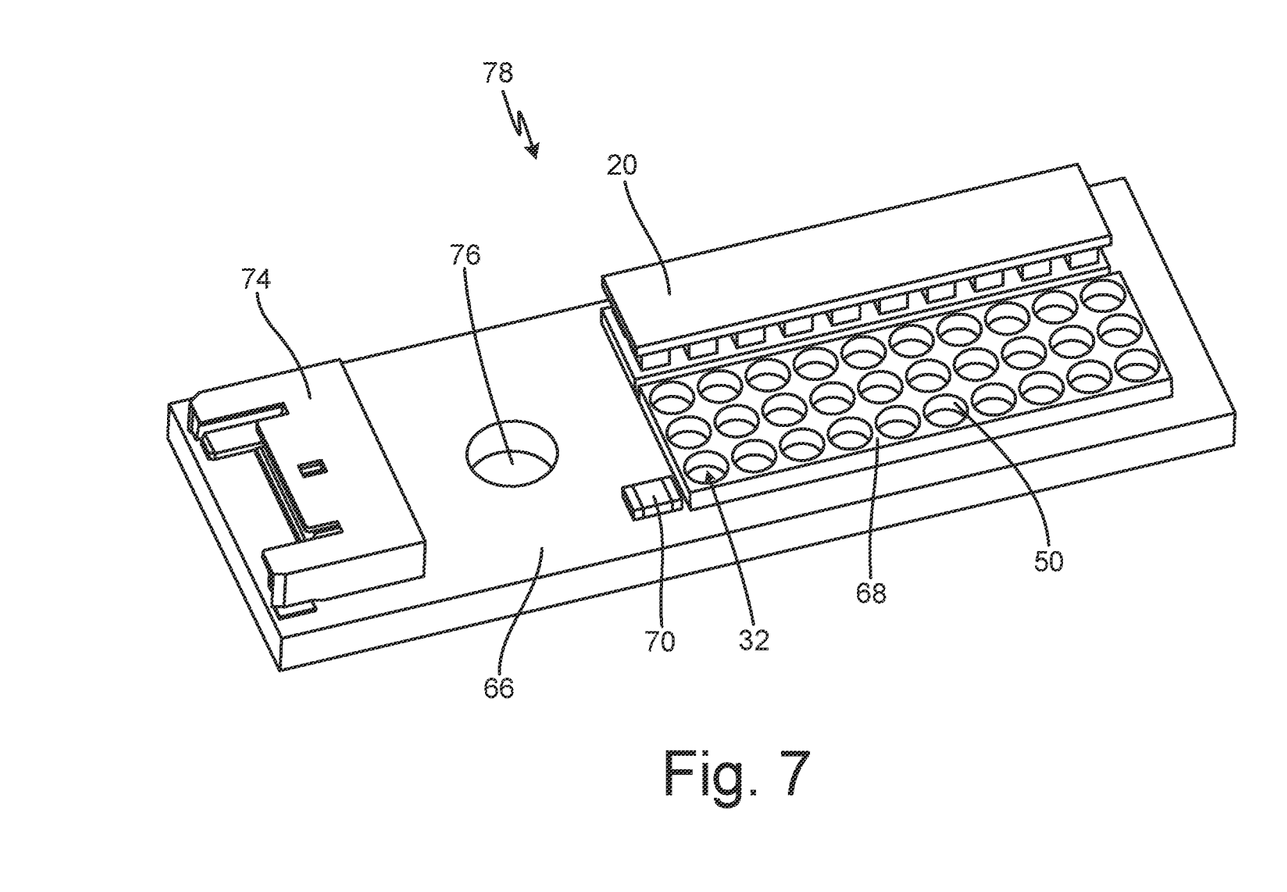
FIG. 7 is a perspective side view of another embodiment of the water intrusion mitigation device.

In an alternate embodiment shown in FIG. 7, water intrusion mitigation device 78 is substantially the same as water intrusion mitigation device 64, except proton exchange membrane 32, second printed circuit board 68, and thermoelectric cooler 20 are disposed on the same side of first printed circuit board 66. Proton exchange membrane 32 can be disposed adjacent to thermoelectric cooler 20 on the surface of first printed circuit board 66. In alternative embodiments, proton exchange membrane 32 can be positioned to partially or fully surround thermoelectric cooler 20 on the surface of first printed circuit board 66. Proton exchange membrane 32 is in thermal communication with first printed circuit board 66 via metal layer 42 and copper coating 38 (not shown). As described with respect to water intrusion mitigation device 18, metal layer 42 can be disposed between proton exchange membrane 32 and copper coating 38 to protect copper coating 38 from the acidic environment created by proton exchange membrane 32 during the process of electrolysis. Copper coating 38 can extend from proton exchange membrane 32 to thermoelectric cooler 20 and can act as a thermal conductor to draw heat from proton exchange membrane 32 and second printed circuit board 68 into thermoelectric cooler 20. Open vias 40 of first printed circuit board 66 can be very narrow to prevent water vapor from entering and condensing therein, while still allowing hydrogen gas to pass through open vias 40 to exit from water intrusion mitigation device 78. In some embodiments, a humidity block filter can be incorporated into open vias 40 to further prevent water vapor from entering and condensing therein.

Water intrusion mitigation device 18, 54, 64, and 78 can protect electronic components or materials sensitive to moisture in enclosures subject to water vapor accumulation by removing water through controlled condensation and electrolysis. Water intrusion mitigation device 18, 54, 64, and 78 consume very little power. For a typical enclosure collecting around 0.09 grams of water vapor per flight, water mitigation device 18, 54, 64, and 78 would only require a total energy of about 1500 joules, which can be consumed over a period of time, for example, about 0.32 watts for one hour to electrolyze 0.9 grams of water. Further, only around 20 milliwatts would be required to power thermoelectric cooler 20, assuming the use of a commercial thermoelectric cooler. Typical circuit boards provided in enclosures subject to water intrusion are coated in parylene to protect electronics from water. The incorporation of water intrusion mitigation device 18, 54, 64, and 78 causes water to be drawn away from other circuitry and thereby minimizes the need for waterproofing. In some embodiments, it may be possible to eliminate parylene coatings, which are expensive, or replace parylene coatings with a polyurethane coating at a much lower cost.

Summation

Any relative terms or terms of degree used herein, such as "substantially", "essentially", "generally", "approximately" and the like, should be interpreted in accordance with and subject to any applicable definitions or limits expressly stated herein. In all instances, any relative terms or terms of degree used herein should be interpreted to broadly encompass any relevant disclosed embodiments as well as such ranges or variations as would be understood by a person of ordinary skill in the art in view of the entirety of the present disclosure, such as to encompass ordinary manufacturing tolerance variations, incidental alignment variations, transient alignment or shape variations induced by thermal, rotational or vibrational operational conditions, and the like. Moreover, any relative terms or terms of degree used herein should be interpreted to encompass a range that expressly includes the designated quality, characteristic, parameter or value, without variation, as if no qualifying relative term or term of degree were utilized in the given disclosure or recitation.

DISCUSSION OF POSSIBLE EMBODIMENTS

The following are non-exclusive descriptions of possible embodiments of the present invention.

A water intrusion mitigation device is configured for use in enclosures housing electric components and equipment that are sensitive to humidity. The water intrusion mitigation device according to an exemplary embodiment of this disclosure, among other possible things, includes a thermoelectric cooler and a water electrolyzer. The thermoelectric cooler has two sides: a first side that is configured to be heated with the application of an electric current and a second side that is configured to cool with the application of an electric current. The water electrolyzer is a proton exchange membrane that is in thermal communication with the second side of the thermoelectric cooler.

The water intrusion mitigation device of the preceding paragraph can optionally include, additionally and/or alternatively, any one or more of the following features, configurations, and/or additional components:

A further embodiment of the foregoing water intrusion mitigation device, wherein the water electrolyzer includes: a first printed circuit board, which has inner and outer sides and a plurality of open vias extending from the inner side to the outer side, and is configured to act as a negative electrode; a first conductive metal layer disposed on the inner side of the first printed circuit board; a second printed circuit board, which has inner and outer sides and a plurality of first openings, and is configured to act as a positive electrode; a second conductive metal layer disposed on the inner side of the second printed circuit board with a plurality of second openings aligned with the first openings; and a proton exchange membrane disposed between the first and second conductive metal layers.

A further embodiment of the water intrusion mitigation device of any of the preceding paragraphs, wherein a thermally conductive member is disposed between the thermoelectric cooler and the outer side of the first printed circuit board and includes a plurality of channels configured to allow hydrogen gas to exit out of the water intrusion mitigation device.

A further embodiment of the water intrusion mitigation device of any of the preceding paragraphs, wherein the thermally conductive member is formed of a porous material having open and connected porosity.

A further embodiment of any of the water intrusion mitigation device of any of the preceding paragraphs, wherein the thermally conductive member comprises a plurality of metal rings, wherein each ring of the plurality of rings circumscribes an opening of each open via of the plurality of open vias.

A further embodiment of the water intrusion mitigation device of any of the preceding paragraphs, wherein each ring of the plurality of rings has a plurality of slits configured to allow hydrogen gas to exit out of the open vias of the water intrusion mitigation device.

A further embodiment of the water intrusion mitigation device of any of the preceding paragraphs, wherein the thermoelectric cooler is operable to generate a 5-10 degrees Celsius temperature differential between the first and second sides wherein the second side of the thermoelectric cooler is configured maintain a temperature above 32 degrees Fahrenheit (0 degrees Celsius).

A further embodiment of the water intrusion mitigation device of any of the preceding paragraphs, wherein the first and second conductive metal layers of the water electrolyzer are made of material selected from the group consisting of platinum, gold, and iridium.

A further embodiment of the water intrusion mitigation device of any of the preceding paragraphs, wherein the first side of the thermoelectric cooler is attached to a wall of the enclosure.

A further embodiment of the water intrusion mitigation device of any of the preceding paragraphs, wherein the enclosure houses a sensor.

A method for controlling humidity levels in enclosures housing electric components.

The method of the preceding paragraph can optionally include, additionally and/or alternatively, any one or more of the following features, configurations, and/or additional components:

A method according to an exemplary embodiment of this disclosure, among other possible things includes cooling a proton exchange membrane of a water electrolyzer using a thermoelectric cooler, condensing water vapor in the enclosure on the positive electrode side of the proton exchange membrane to form liquid water, splitting the liquid water into hydrogen and oxygen gases, and releasing the hydrogen and oxygen gases back into the enclosure.

A further embodiment of the method, wherein the proton exchange membrane is disposed between a first printed circuit board configured to act as a negative electrode and a second printed circuit board configured to act as a positive electrode, and wherein the thermoelectric cooler is disposed adjacent the first printed circuit board;

A further embodiment of the method, wherein the hydrogen gas is channeled from a negative electrode side of the proton exchange membrane through the first printed circuit board.

A further embodiment of the method of any of the preceding paragraphs, wherein the hydrogen gas is channeled through a plurality of vias extending through the first printed circuit board.

A further embodiment of the method of any of the preceding paragraphs, wherein the hydrogen gas is channeled through a thermally conductive member disposed between the thermoelectric cooler and first printed circuit board.

A further embodiment of the method of any of the preceding paragraphs, wherein the thermally conductive member is a porous membrane configured to transfer hydrogen gas received from the first printed circuit board to the enclosure.

A further embodiment of the method of any of the preceding paragraphs, wherein the thermally conductive member is a plurality of slotted rings, wherein each slotted ring of the plurality of slotted rings is disposed around an opening of a via of the plurality of vias.

A further embodiment of the method of any of the preceding paragraphs, wherein a hot side of the thermoelectric cooler is attached to an inside wall of the enclosure.

A further embodiment of the method of any of the preceding paragraphs, wherein the second printed circuit board includes a plurality of openings that expose surface portions of the proton exchange membrane and wherein the water vapor condenses on the surface portions.

A further embodiment of the method of any of the preceding paragraphs, wherein oxygen gas is released to the enclosure through the plurality of openings in the second printed circuit board.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A water and humidity intrusion mitigation device for use in enclosures housing electronic components or materials sensitive to moisture, the water and humidity intrusion mitigation device comprising:
    a thermoelectric cooler comprising:
        a first side configured to be heated with the application of an electric current; and
        a second side configured to be cooled with the application of an electric current;
    a water electrolyzer comprising:
        a first printed circuit board having inner and outer sides and comprising a plurality of open vias extending from the inner side to the outer side, the first printed circuit board configured to act as a negative electrode;
        a first conductive metal layer disposed on the inner side of the first printed circuit board;
        a second printed circuit board disposed on the inner side of the first printed circuit board, the second printed circuit board having inner and outer sides and a plurality of first openings, and being configured to act as a positive electrode;
        a second conductive metal layer disposed on the inner side of the second printed circuit board, the second conductive layer having a plurality of second openings aligned with the first openings; and
        a proton exchange membrane in thermal communication with the second side of the thermoelectric cooler and disposed between the first and second conductive metal layers, wherein the plurality of first and second openings expose the outer surface of the proton exchange membrane.

2. The water and humidity intrusion mitigation device of claim 1 and further comprising a thermally conductive member disposed between the thermoelectric cooler and the outer side of the first printed circuit board of the water electrolyzer, the conductive member including a plurality of channels configured to allow hydrogen gas to exit out of the water intrusion mitigation device.

3. The water and humidity intrusion mitigation device of claim 2, wherein the thermally conductive member is formed of a porous material having open and connected porosity.

4. The water and humidity intrusion mitigation device of claim 2, wherein the thermally conductive member comprises a plurality of metal rings, wherein each ring of the plurality of rings circumscribes an opening of each open via of the plurality of open vias.

5. The water and humidity intrusion mitigation device of claim 4, wherein each ring of the plurality of rings has a plurality of slits configured to allow hydrogen gas to exit out of the open vias of the water intrusion mitigation device.

6. The water and humidity intrusion mitigation device of claim 1, wherein the thermoelectric cooler is operable to generate a 5-10 degrees Celsius temperature differential between the first and second sides, wherein the second side of the thermoelectric cooler is configured maintain a temperature above 32 degrees Fahrenheit (0 degrees Celsius).

7. The water and humidity intrusion mitigation device of claim 1, wherein the first and second conductive metal layers of the water electrolyzer are made of material selected from the group consisting of platinum, gold, and iridium.

8. The water and humidity intrusion mitigation device of claim 1, wherein the first side of the thermoelectric cooler is attached to a wall of the enclosure.

9. The water and humidity intrusion mitigation device of claim 7, wherein one of the first printed circuit board and the second printed circuit board includes circuitry for an electronic component in the enclosure.

10. A method for controlling humidity levels in enclosures housing electric components or materials sensitive to moisture, the method comprising:
    cooling a proton exchange membrane of a water electrolyzer using a thermoelectric cooler, wherein the thermoelectric cooler includes a first side configured to be heated with the application of an electric current and a second side configured to be cooled with the application of an electric current wherein the water electrolizer comprises:
        a first printed circuit board having inner and outer sides and comprising a plurality of open vias extending from the inner side to the outer side, the first printed circuit board configured to act as a negative electrode;
        a first conductive metal layer disposed on the inner side of the first printed circuit board;
        a second printed circuit board disposed on the inner side of the first printed circuit board, the second printed circuit board having inner and outer sides and a plurality of first openings, and being configured to act as a positive electrode;
        a second conductive metal layer disposed on the inner side of the second printed circuit board, the second conductive layer having a plurality of second openings aligned with the first openings; and
        a proton exchange membrane in thermal communication with the second side of the thermoelectric cooler and disposed between the first and second conductive metal layers, wherein the plurality of first and second openings expose the outer surface of the proton exchange membrane;
    condensing water vapor in the enclosure on the positive electrode side of the proton exchange membrane to form liquid water;
    splitting the liquid water into hydrogen and oxygen gases; and
    releasing the hydrogen and oxygen gases back into the enclosure.

11. The method of claim 10, wherein releasing the hydrogen gas comprises channeling the hydrogen gas from a negative electrode side of the proton exchange membrane through the first printed circuit board.

12. The method of claim 11, wherein the hydrogen gas is channeled through the plurality of vias extending through the first printed circuit board.

13. The method of claim 12, wherein the hydrogen gas is channeled through a thermally conductive member disposed between the thermoelectric cooler and first printed circuit board.

14. The method of claim 13, wherein the thermally conductive member is a porous membrane configured to transfer hydrogen gas received from the first printed circuit board to the enclosure.

15. The method of claim 13, wherein the thermally conductive member is a plurality of slotted rings, wherein each slotted ring of the plurality of slotted rings is disposed around an opening of a via of the plurality of vias.

16. The method of claim 13 and further comprising attaching a hot side of the thermoelectric cooler to an inside wall of the enclosure.

17. The method of claim 13, wherein the first openings of the second printed circuit expose surface portions of the proton exchange membrane and wherein the water vapor condenses on the surface portions.

18. The method of claim 17, wherein oxygen gas is released to the enclosure through the plurality of first openings in the second printed circuit board.

* * * * *